United States Patent

Henschen et al.

[11] Patent Number: 5,267,126
[45] Date of Patent: Nov. 30, 1993

[54] ELECTRICAL INTERCONNECTION SYSTEM

[75] Inventors: Homer E. Henschen, Carlisle, Pa.; Paul D. Zakary, Winston-Salem, N.C.

[73] Assignee: The Whitaker, Corporation, Wilmington, Del.

[21] Appl. No.: 676,639

[22] Filed: Mar. 28, 1991

[51] Int. Cl.$^5$ .......................................... H02B 1/056
[52] U.S. Cl. .................................. 361/826; 174/251; 361/749; 439/65
[58] Field of Search ............... 361/398, 400, 412, 413, 361/428; 174/251, 255, 261, 268; 439/34, 65, 67, 77

[56] References Cited

U.S. PATENT DOCUMENTS

| | | | |
|---|---|---|---|
| 3,242,384 | 3/1966 | Klehm, Jr. | 361/398 |
| 3,579,206 | 5/1971 | Grange | 361/398 |
| 4,306,275 | 12/1981 | Miura | 361/413 |
| 4,593,452 | 6/1986 | Keahey et al. | 29/564.6 |
| 4,602,316 | 7/1986 | Feick | 361/412 |
| 4,682,828 | 7/1987 | Piper et al. | 439/77 X |
| 4,684,765 | 8/1987 | Beck et al. | 361/406 |
| 4,820,189 | 4/1989 | Sergeant et al. | 439/395 |
| 4,842,525 | 6/1989 | Galloway et al. | 439/34 |
| 5,008,496 | 4/1991 | Schmidt et al. | 36/398 X |
| 5,012,391 | 4/1991 | Schultz, Jr. et al. | 361/428 |

FOREIGN PATENT DOCUMENTS

| | | | |
|---|---|---|---|
| 2502445 | 9/1982 | France | 361/412 |
| 0227441 | 9/1988 | Japan | 439/34 |
| 1-287987 | 11/1989 | Japan | 361/412 |
| 2-132876 | 5/1990 | Japan | 439/65 |
| 2-189992 | 7/1990 | Japan | 439/65 |

*Primary Examiner*—Leo P. Picard
*Assistant Examiner*—Don Sparks
*Attorney, Agent, or Firm*—William B. Noll; Timothy J. Aberle

[57] ABSTRACT

This invention is directed to an electrical interconnection system composed of a plurality of interconnected circuit panel subassemblies, where each subassembly is preferably formed by a reaction injection molding (RIM) process. Each subassembly includes a plurality of spaced apart sites for establishing electrical contact to an electrical component, and an encapsulated conductive grid network joining certain of the respective spaced apart sites. A feature of this invention is that the conductive grid network includes flexible, insulative conductors which are unencapsulated and extend between adjacent pairs of subassemblies. By this arrangement, it is possible to fabricate and terminate the subassemblies, planarly arranged, by robotics, whereupon the subassemblies may then be moved relative to each other to form a nonplanar or three-dimensional assembly, such as an electromechanical structure to which further electrical components may be secured.

6 Claims, 8 Drawing Sheets

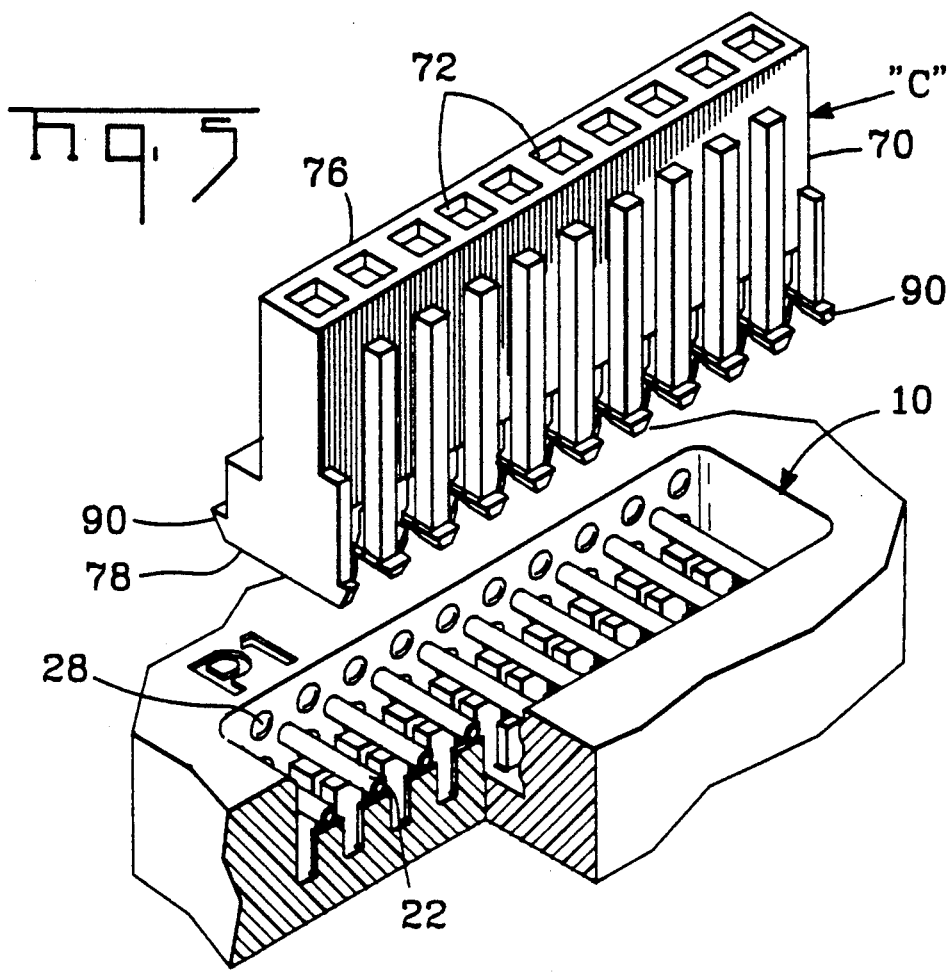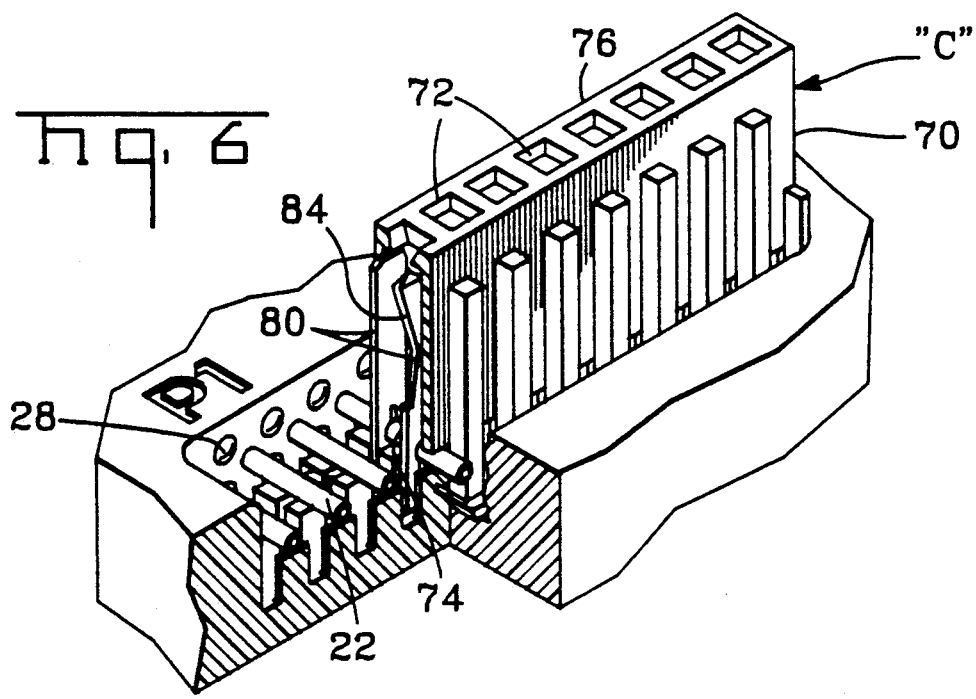

ELECTRICAL INTERCONNECTION SYSTEM

FIELD OF THE INVENTION

This invention relates to an electrical interconnection system that includes a plurality of interconnected circuit panel subassemblies, preferably formed by reaction injection molding (RIM). A plurality of electromechanical components, mounted on said subassemblies, may be electrically interconnected by an electrically conductive grid network encapsulated within said subassemblies. More particularly, this invention relates to plural electrical harness subassemblies where a pair of subassemblies are joined by plural flexible unencapsulated wires forming part of said conductive grid network.

BACKGROUND OF THE INVENTION

Electrical harnesses are typically made of electrical conductor wire which are mostly individually stranded and insulated wires with an occasional uninsulated stranded or solid wire utilized for grounding or the like. These wires are typically terminated by electrical terminals and/or connectors and formed into some general shape suitable for inventory and handling by the use of tape or harness ties. Fasteners may or may not be employed by affix the harness to the apparatus in which the harness is used. The harness wires serve the function of supplying power and signals to the various components of such apparatus in which the harness is used. The harness may be a simple one, having only several short wires only a few inches in length utilized to interconnect the components of a simple circuit in an apparatus such as a camera or smoke alarm, or it may have literally hundreds of wires terminated in very expensive connectors and utilized to interconnect all of the different devices and components of a complex circuit as an aircraft. The harness constitutes a subassembly to be loaded into the apparatus on a production line as, for example, with respect to appliances such as washers, dryers, copy machines, stoves, refrigerators and the like; or, added piece-meal as the apparatus moves along a production line. Generally speaking, a harness is a flexible assembly having a non-rigid shape, such as a plurality of discrete wires which are bundle tied together and terminated at ends thereof for interconnection to a panel or other end components. These harnesses are difficult to handle by machine, making it difficult to automate either harness making or harness handling or to employ robotic assembly techniques. Installation errors are common. This fact has frustrated industry for decades and, notwithstanding substantial efforts to automate or robotize harness making or harness manipulation, most harnesses are currently manufactured and installed in a highly labor intensive manner which impacts not only on cost but also on quality. One technique which has been employed in the use of robotic means to deploy wires on a harness board. One example is shown in U.S. Pat. No. 4,593,452.

Attempts have been made to simplify and improve the procedure. One approach, as described in U.S. Pat. No. 4,820,189, teaches a method of forming electrical wiring harnesses by implanting electrical wires into grooves in a panel laid out in a geometry or pattern suitable to effect wire distribution in the appliance. The panel can be formed from various materials including reaction injection molded (RIM) plastics. The wires are terminated as desired by using an insulation displacement contact mounted in an insulated body which engages the wires as the wires are rolled in grooves past the insulation displacement contact. However, a single appliance may require a large number of different connectors. U.S. Pat. No. 4,684,765 discloses a bus assembly or harness formed by wires deployed on an insulative plate having a plurality of terminal stations.

RIM panels have been used not only as a wire template as described above but have been widely used as structural components. RIM differs from conventional molding in several aspects. In the RIM process, two separate materials are injected into a mold. The component materials react with each other to form a cured part. These two component materials have viscosities which are much lower than a conventional thermo plastic or the reaction product of the two components. For this reason, RIM molding can be conducted at a much lower pressure than a conventional molding process, for example, at 100 psi as opposed to 4000 psi. Reaction injection molding also comprises a low temperature process which employs low viscosity materials. Large panels, a capability of the RIM process, may comprise three dimensional enclosures, while an added feature thereof is that metallic support brackets or screw fasteners can be molded in the RIM panels.

SUMMARY OF THE INVENTION

This invention is directed to an electrical interconnection system composed of a plurality of interconnected circuit panel subassemblies. Each said subassembly includes a plurality of spaced apart sites for establishing electrical contact to an electrical component, and an encapsulated conductive grid network joining certain of the respective spaced apart sites. A feature of this invention is that the conductive grid network includes flexible, insulative conductors which are unencapsulated and extend between adjacent pairs of subassemblies. By this arrangement, it is possible to fabricate and terminate the subassemblies, planarly arranged, by robotic means, whereupon the subassemblies may then be moved relative to each other to form a nonplanar or three-dimensional assembly.

BRIEF DESCRIPTION OF THE DRAWINGS

FIG. 5 is an enlarged, partial perspective view of a preloading position for an electrical component into a component site.

FIG. 6 is a view similar to FIG. 5 showing the final termination position for an electrical component.

DETAILED DESCRIPTION OF THE PREFERRED EMBODIMENT

Figure 1:
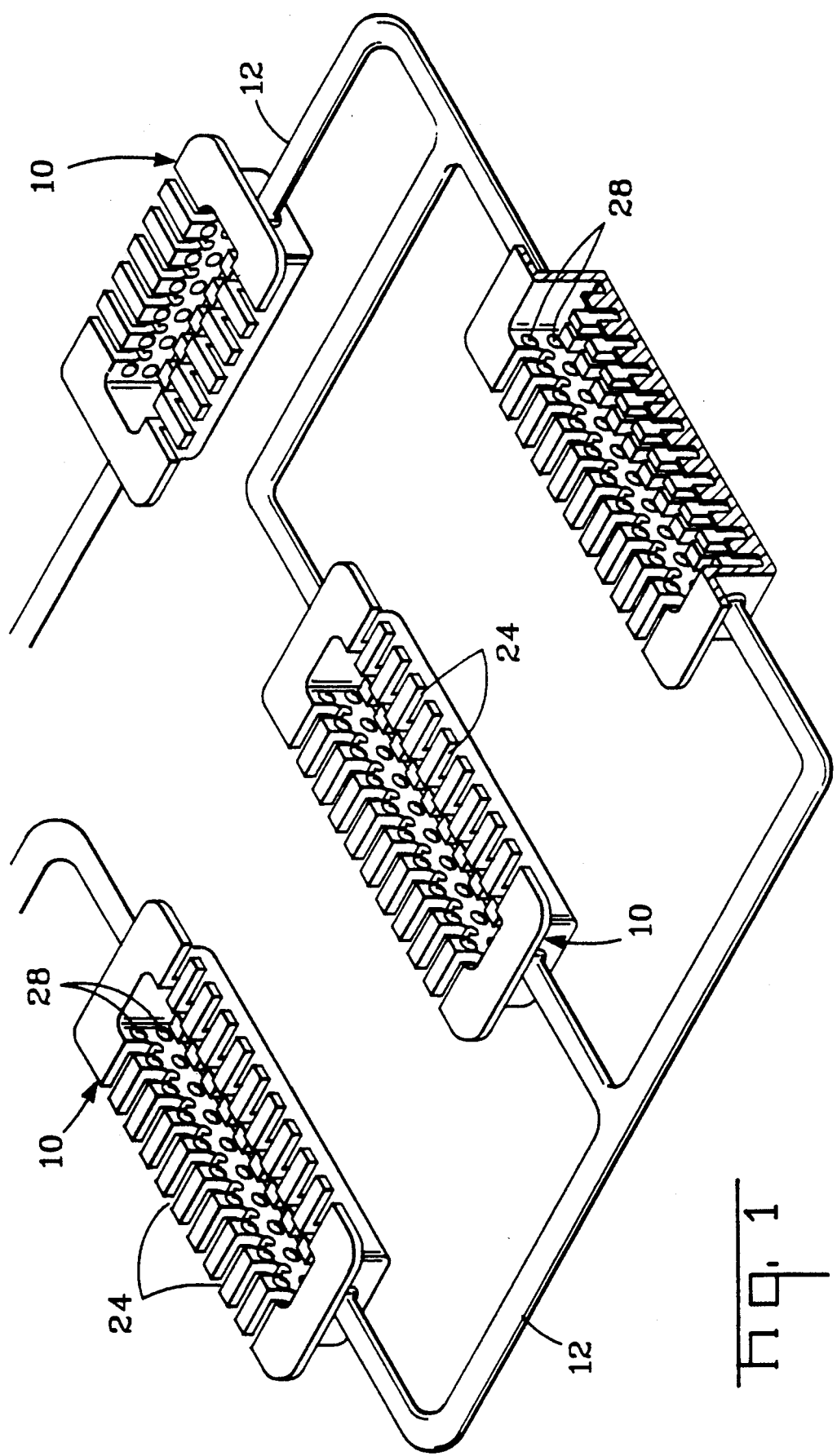
FIG. 1 is a simplified view illustrating a preliminary operation in the production of a circuit panel subassembly according to this invention.

Turning now to the several figures, FIG. 1 illustrates a preliminary step in the manufacture of the electrical interconnection system of this invention. Electrical component sites, in the form of premolded, elongated cups 10 are arranged in a pattern consistent with their location within a subassembly panel, as more fully described hereinafter. Such cups 10 may be joined together by integral runners 12 forming a wire organizing frame to give stability to the arrangement during the laying of the conductive grid network and encapsulation by the RIM practice.

Figure 2:
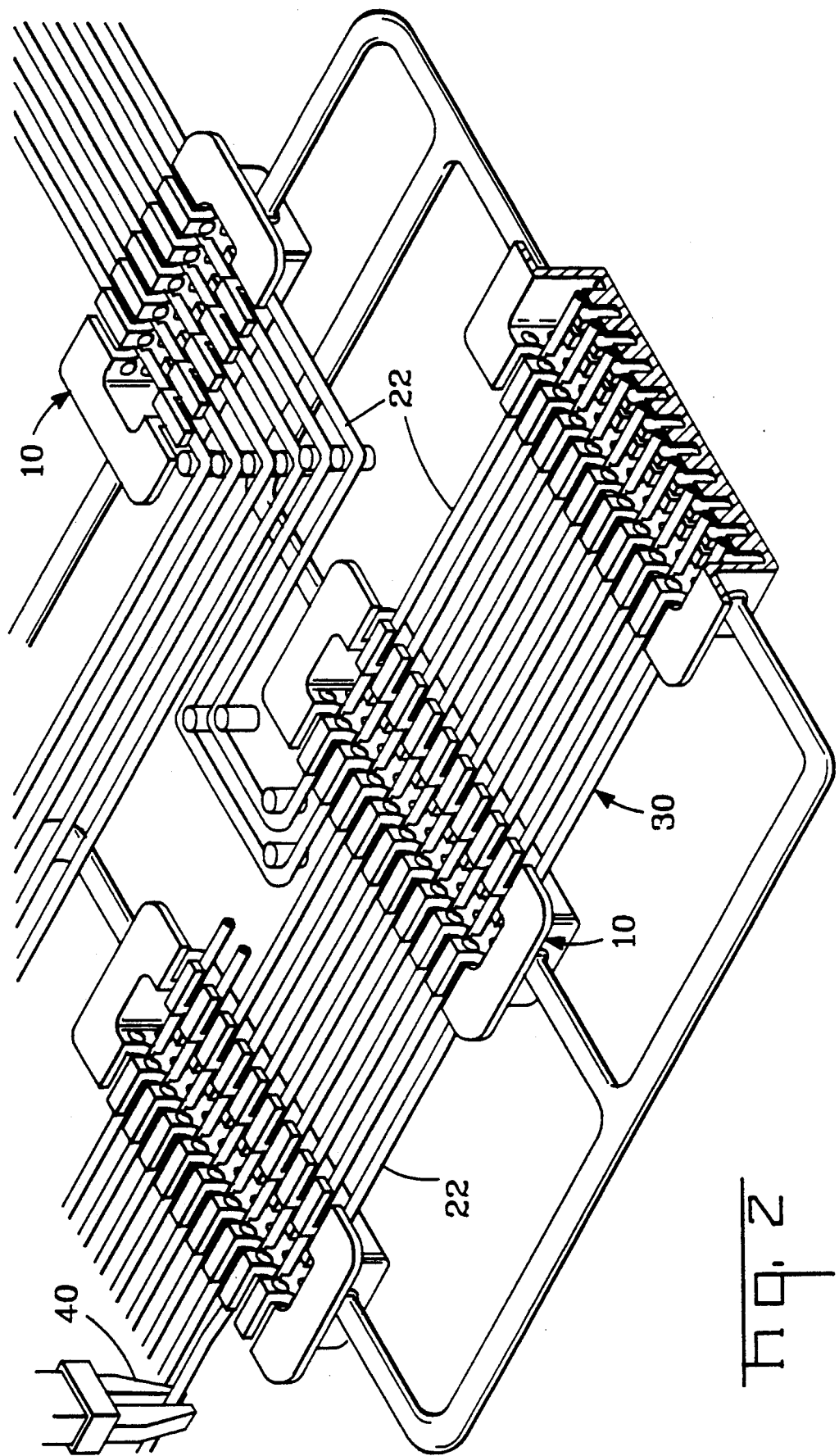
FIG. 2 is a view similar to FIG. 1 showing the conductive grid network arranged between electrical component sites prior to RIM encapsulation.
Figure 3:
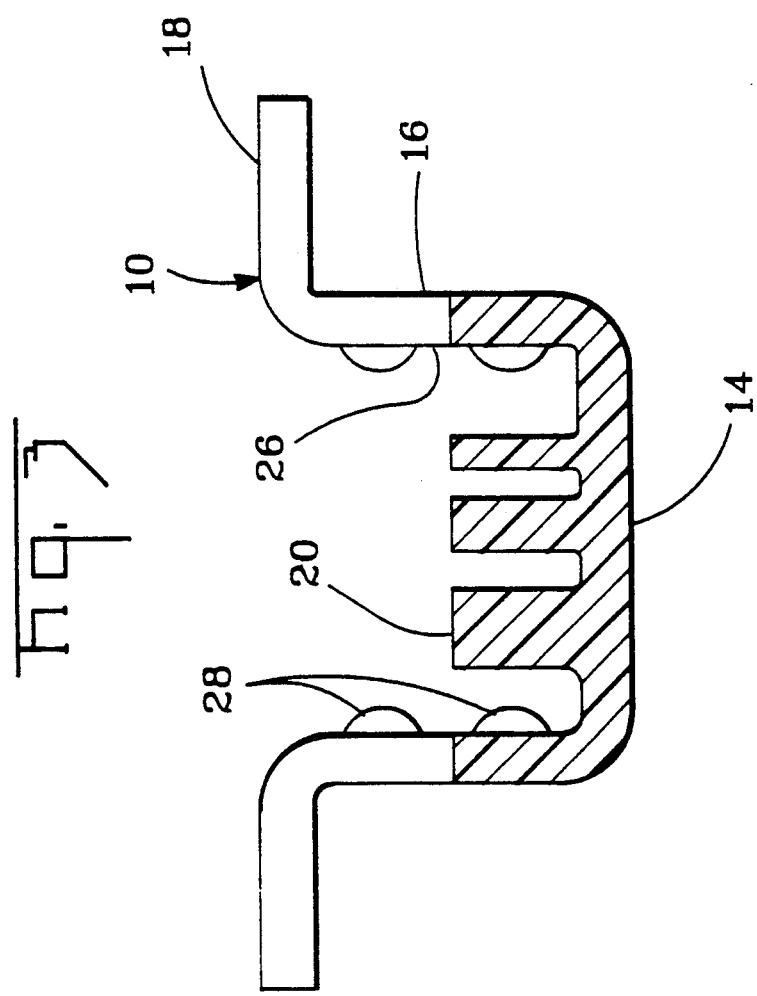
FIG. 3 is an enlarged sectional view of one of the electrical component sites illustrated in FIG. 1.

The premolded, elongated caps 10, illustrated in FIGS. 1-3, include a base 14 and encircling, upstanding side walls 16. About the top edge of sidewalls 16 is a flange 18. Projecting from the base are plural pedestals 20, one for each conductor 22, forming the conductive grid network as hereinafter described. The sidewalls 16, along the major dimension of the cup 10, and corresponding flange 18 are slotted 24 to receive the plural conductors 22. Thus, as the conductors 22 are laid in the slots 24, they are caused to lie against and be supported by, a respective pedestal 20. Intermediate each of the slots 24, along the inner wall 26, are plural pins of vertically aligned projections 28 which are intended to cooperate with an electrical component to be inserted into the cup 10. This cooperation will become more apparent in the description which follows.

With the components sites or cups 10 suitably arranged, the conductive grid network 30, formed of the discrete, insulated conductors 22, is laid into the desired pattern by means of the wire organizing frame (10,12), see FIG. 2. One of the advantages of the RIM system, as used herein, is that conductors may be cut, as at 40, and exposed temporarily since subsequent RIM encapsulation of the severed conductors outside the component sites 10 will ensure the electrical integrity of the system. In any case, as more fully described in co-pending application, Ser. No. (14392), the wire organizing frame (10,12) may be positioned within a template and mold, not shown. The mold need only be suitable for handling the relatively low pressures and temperatures needed to fabricate a reaction injection molded (RIM) structure of conventional construction. With electrically conductive grid network and wire organizing frame positioned within the mold, RIM subassembly panel can be fabricated, FIG. 4. This RIM panel would, in the preferred embodiment of this invention, correspond to at least one of housing walls of the apparatus in which this circuit panel subassembly or harness is employed.

Figure 4:
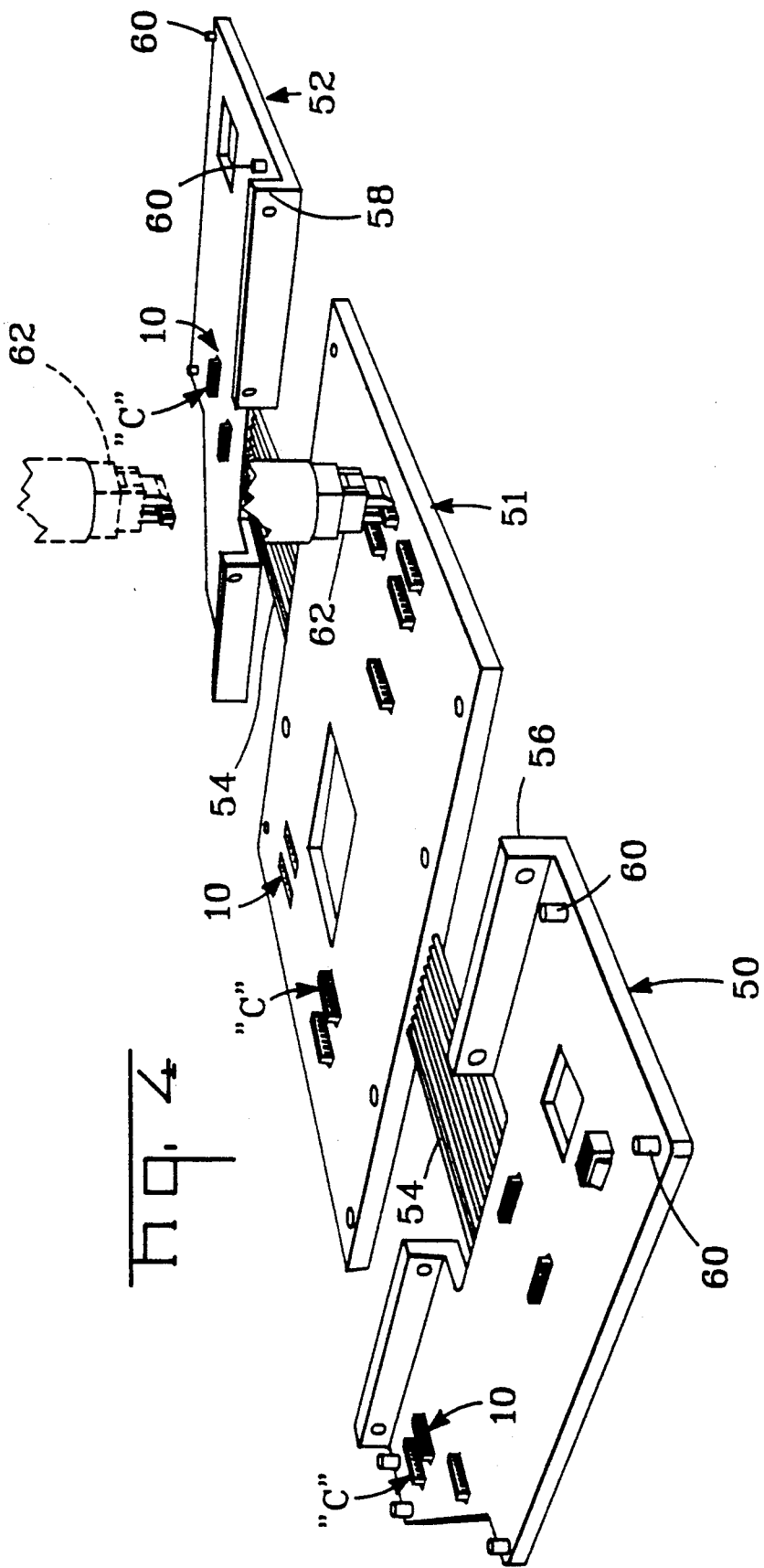
FIG. 4 is a perspective view of a preferred embodiment of an electrical interconnection system according to this invention, illustrating three circuit panel subassemblies, and the robotic termination of one of said subassemblies.

FIG. 4 illustrates the preferred arrangement for fabricating plural subassembly panels 50, 51, 52, arranged planarly in a side-by-side manner. It will be observed that each RIM fabricated subassembly panel has been molded with portals and plural component sites 10, where the latter are joined together by an encapsulated grid network, no longer visible, except for the flexible, unencapsulated conductors 54 extending between the respective subassembly panels. The center subassembly panel 51 has been shown as a flat panel, and for the preferred embodiment, will comprise the base or floor of the three dimensional assembly illustrated in FIG. 10. The remaining panels 50, 52, which eventually will constitute side panels, have been molded with support flanges 56, 58 and plural mounting posts 60.

Figure 7:
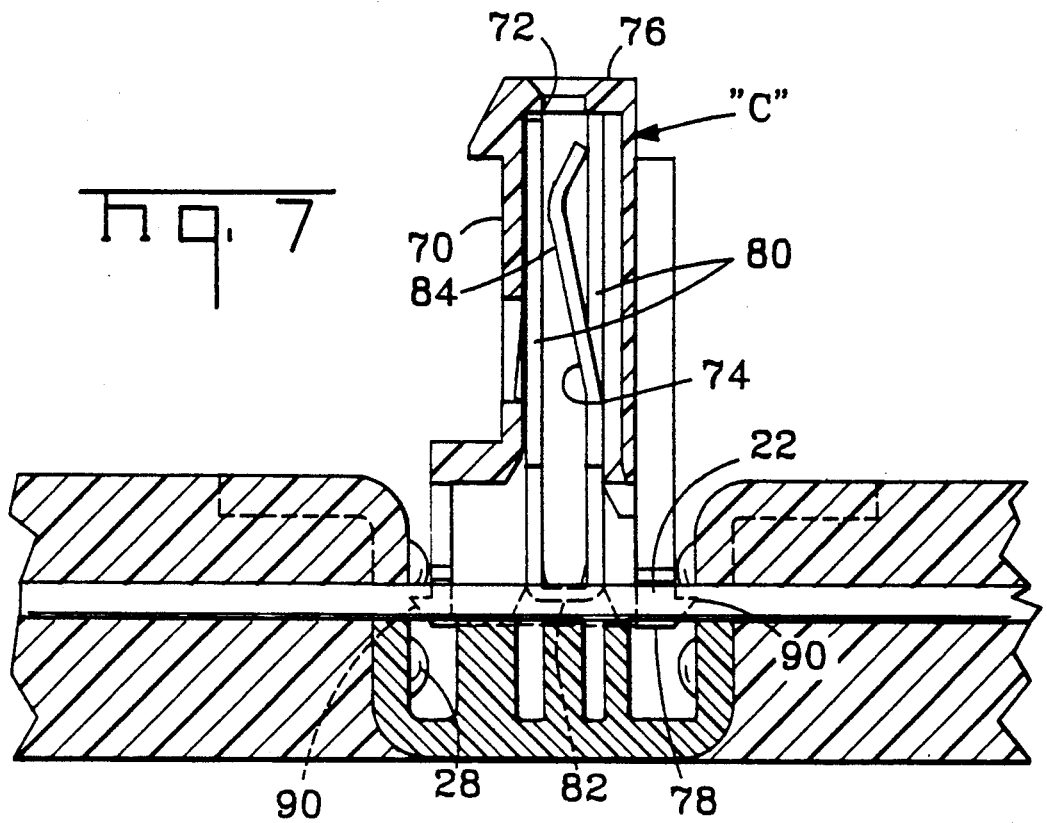
FIG. 7 is an enlarged sectional view showing an initial loading position for an electrical component into a component site.
Figure 8:
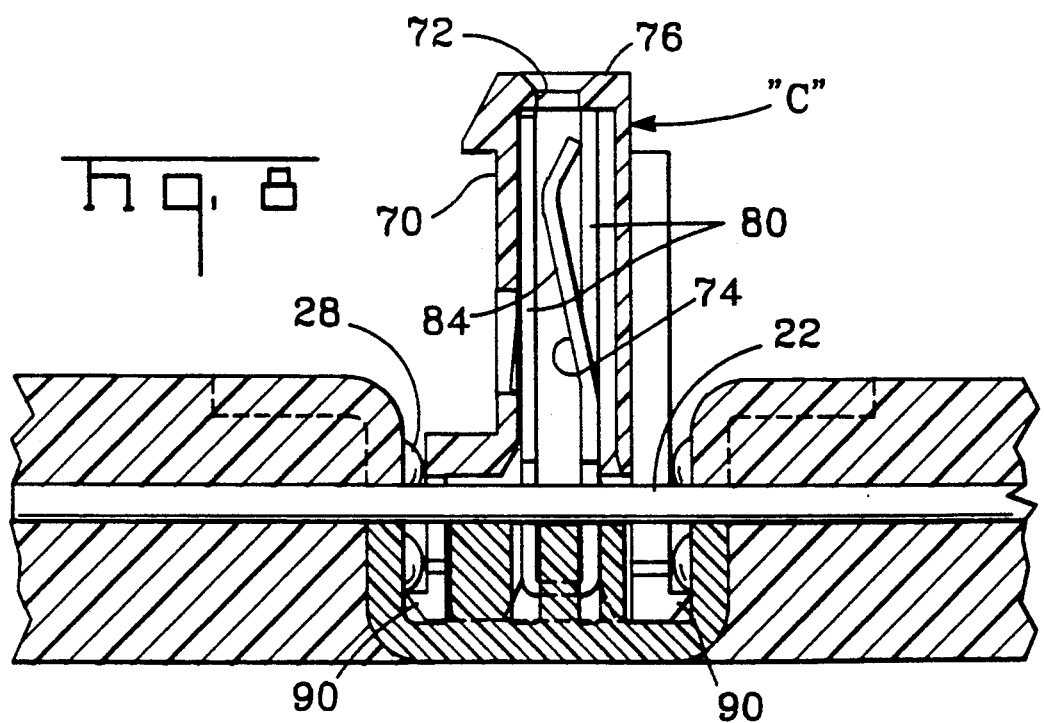
FIG. 8 is a view similar to FIG. 7 showing the component termination position in FIG. 6.

One of the distinct advantages in the fabrication of the assembly is further illustrated in FIG. 4. A robotic hood 62 may be employed to place appropriate, but conventional, electrical components "C" into each of the component sites 10. There are a number of conventional electrical connectors or components which can be used in the system of this invention. One such component is illustrated in FIGS. 5-8. Such component "C" is characterized by a plastic or dielectric housing 70 containing a plurality of through cavities 72 where each cavity receives and retains contact member 74, extending between a mating end 76 and lower surface 78. The contact member 74 comprises an electrical contact fabricated from a stamped and formed metal sheet blank. The contact member 74 may consist of a pair of parallel arms 80 extending from a bight region 82, where the bight region has been provided with a pair of insulation displacement slots, as known in the art. The open end of the contact member 74 namely the spaced apart parallel arms 80, may be provided with a cantilevered arm 84, struck from one arm 80, whereby a male tab or post may be inserted into the mating end 76 into electrical engagement with contact member 74, as well known in the art. With the contact member 74 vertically oriented within the component "C", i.e. parallel to the axis of the component housing, an insulation displacement connection (IDC) may be readily effected by robotic means. That is, a normal force against the component housing will cause the IDC slots to engage and cut into the conductor insulation of the conductors 22 within the component sites 10, and effect electrical contact therewith. FIGS. 7 and 8, respectively, represent the preloading and final engagement of the electrical component "C" with conductors 22. Externally of the component housing, barbs 90 or outwardly directed projections are provided to engage and retain the electrical component "C" by the projections 28. Finally, FIGS. 7 and 8 illustrate that the component cups 10 are essentially fully encased within the RIM material, and that the conductors 22, the portions outside the side walls 16 are fully encapsulated.

Figure 9:
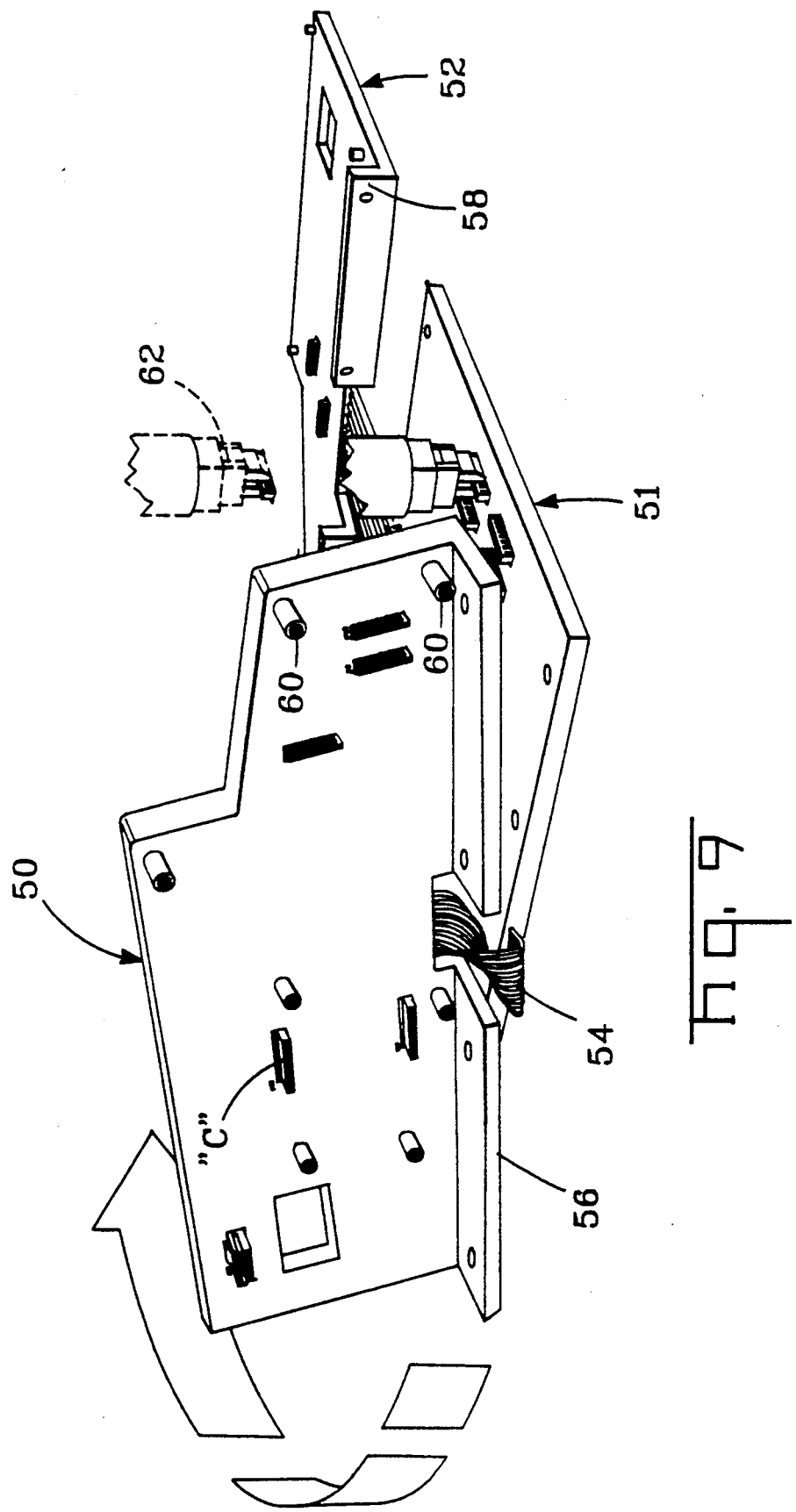
FIG. 9 is a perspective view illustrating the manner for assembling the system hereof into a three-dimensional or nonplanar structure.
Figure 10:
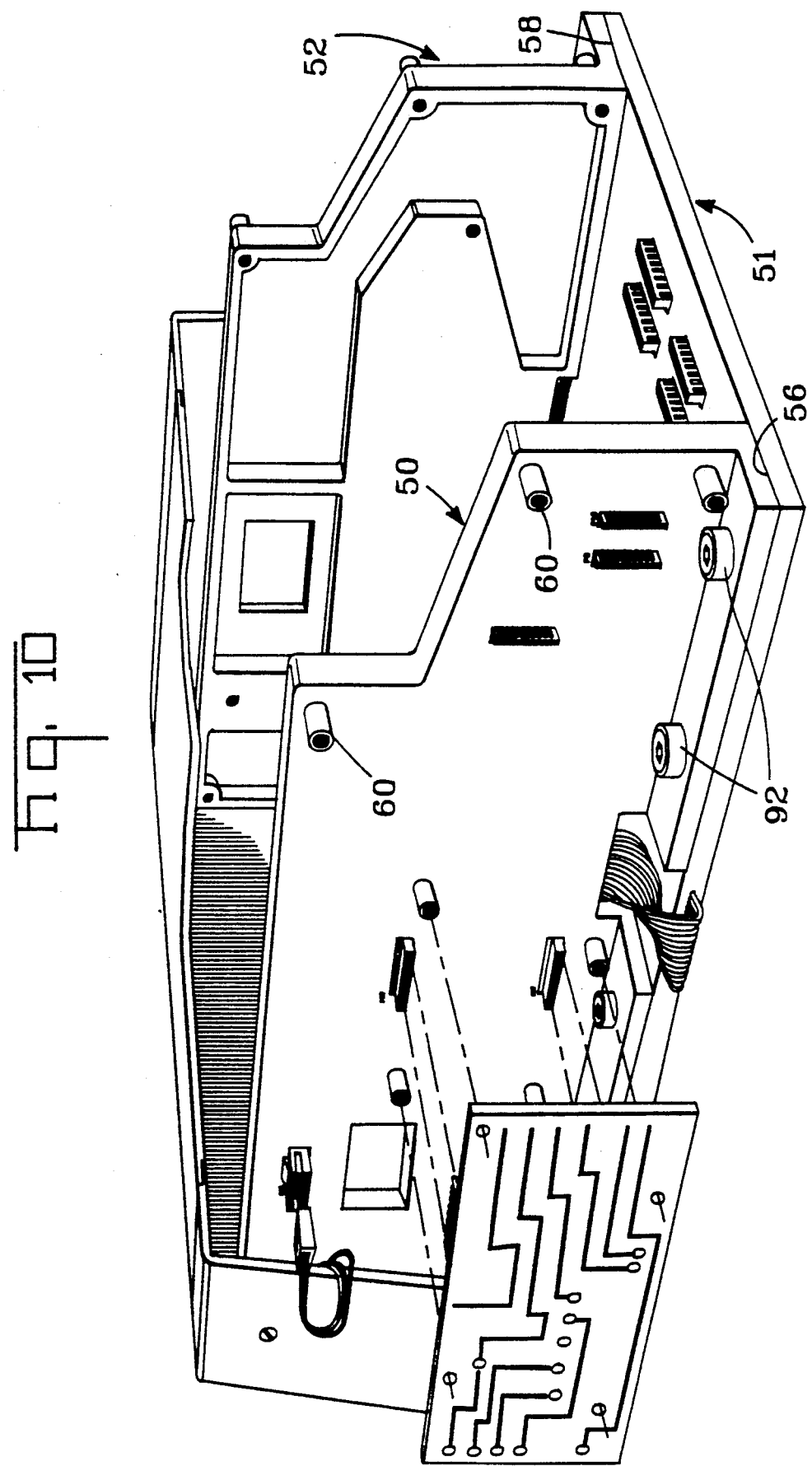
FIG. 10 is a perspective view illustrating the assembled system of this invention, where such system may be incorporated into an electronically controlled apparatus, such as a copier machine.

Turning now to FIGS. 9 and 10, when all electrical components have been fully and finally engaged at their appropriate site 10, the outer subassembly panels 50, 52 may be lifted and turned so that the support flanges 56, 58 lie contiguous with the edge surface of subassembly panel 51. In this position, the subassembly panels may be fastened together, such as by adhesive or by fastening means 92, see FIG. 10. The three joined subassembly panels now form an electromechanical structure to which further components or PCBs may be secured, followed by a suitable cover fastened to posts 60.

We claim:

1. An electrical interconnection system comprising:
   a plurality of interconnected circuit panel subassemblies, wherein each said subassembly includes a plurality of spaced apart sites for establishing electrical contact to an electrical component, and a conductive grid network joining certain of the respective spaced apart sites;

said conductive grid network includes flexible, insulated conductors which are unencapsulated and extend between adjacent pairs of subassemblies;

each said subassembly includes means for securing same to at least one other subassembly;

said spaced apart sites include cups of generally U-shaped cross-section;

said cups include sidewalls with a flange member which projects outwardly of said side walls, at least a pair of said side walls having an interior surface with at least a pair of rows of inwardly projecting members;

said cups further including upwardly extending, generally flat-topped pedestal members formed integrally with a base of said cross-section for supporting conductors across said slat top when conductors are transversely disposed thereon relative to a longitudinal axis of said pedestals;

whereby adjacent pairs of subassemblies are pivoted about said unencapsulated, flexible, insulated conductors to align said last named means to form a standing, nonplanar assembly.

2. The electrical interconnection system according to claim 1 wherein said conductive grid network comprises insulation contained metal wires, and that said insulation contained wires are exposed at each said site.

3. The electrical interconnection system according to claim 2 wherein a portion of the insulation contained metal wires within a site is provided with a pedestal support to allow the joining of an electric component to said insulation contained metal wires.

4. The electrical interconnection system according to claim 3 including means for securing an electrical component within a said site.

5. The electrical interconnection system according to claim 3 wherein each said site is a premolded member adapted to receive plural electrical conductors prior to RIM encapsulation.

6. The electrical interconnection system according to claim 1 wherein said grid network includes a conductor to common plural sites within a subassembly.

* * * * *